(12) United States Patent
Saitoh et al.

(10) Patent No.: US 11,040,517 B2
(45) Date of Patent: Jun. 22, 2021

(54) PRINTED WIRING BOARD AND SEMICONDUCTOR PACKAGE

(71) Applicant: HITACHI CHEMICAL COMPANY, LTD., Tokyo (JP)

(72) Inventors: Takeshi Saitoh, Tokyo (JP); Yukio Nakamura, Tokyo (JP); Ryohta Sasaki, Tokyo (JP); Junki Somekawa, Tokyo (JP); Yuji Tosaka, Tokyo (JP); Hiroshi Shimizu, Tokyo (JP); Ryoichi Uchimura, Tokyo (JP)

(73) Assignee: Showa Denko Materials Co., Ltd., Tokyo (JP)

( * ) Notice: Subject to any disclaimer, the term of this patent is extended or adjusted under 35 U.S.C. 154(b) by 71 days.

(21) Appl. No.: 16/348,250

(22) PCT Filed: Nov. 9, 2017

(86) PCT No.: PCT/JP2017/040472
§ 371 (c)(1),
(2) Date: May 8, 2019

(87) PCT Pub. No.: WO2018/088493
PCT Pub. Date: May 17, 2018

(65) Prior Publication Data
US 2019/0315094 A1    Oct. 17, 2019

(30) Foreign Application Priority Data
Nov. 9, 2016 (JP) .............................. JP2016-219240

(51) Int. Cl.
*H05K 1/03*     (2006.01)
*B32B 15/08*    (2006.01)
(Continued)

(52) U.S. Cl.
CPC .......... *B32B 15/08* (2013.01); *H01L 23/3114* (2013.01); *H05K 1/0298* (2013.01); *H05K 1/0306* (2013.01); *H05K 1/036* (2013.01)

(58) Field of Classification Search
CPC ............ H05K 1/02; H05K 1/03; H05K 1/028; H05K 1/036; H05K 1/0366; B32B 15/08; B32B 15/14; B32B 15/20
(Continued)

(56) References Cited

U.S. PATENT DOCUMENTS 5,045,381 A * 9/1991 Suzuki ............... C08G 18/6705
                                                          428/209
7,662,184 B2 * 2/2010 Edwards ............... A61L 27/365
                                                          623/17.11
(Continued)

FOREIGN PATENT DOCUMENTS

JP     H07-241957 A    9/1995
JP     2001-111218 A   4/2001
(Continued)

*Primary Examiner* — Tuan T Dinh
(74) *Attorney, Agent, or Firm* — Fitch, Even, Tabin & Flannery, LLP

(57) ABSTRACT

Provided are a printed circuit board in which warps are effectively suppressed, and a semiconductor package having a semiconductor device mounted on said printed circuit board, even though circuit patterns of different amounts of metal are formed on both sides of one cured product of a prepreg. Specifically, said printed circuit board is a printed circuit board which comprises a cured product of a prepreg comprising a fiber base material and a resin composition, in which circuit patterns of different amounts of metal are formed on both sides of one cured product of the prepreg, in which said prepreg has layers on the front and back of said fiber base material, wherein said layers comprise resin compositions having different heat curing shrinkage rates, in which among these layers, the layer made of the resin
(Continued)

composition having a smaller heat curing shrinkage rate is present on the side on which the circuit pattern with a smaller amount of metal is formed.

7 Claims, 1 Drawing Sheet

(51) Int. Cl.
*H01L 23/31* (2006.01)
*H05K 1/02* (2006.01)

(58) Field of Classification Search
USPC .......... 361/760–767, 791–793; 174/250–258
See application file for complete search history.

(56) References Cited

U.S. PATENT DOCUMENTS

| | | | |
|---|---|---|---|
| 8,227,361 B2* | 7/2012 | Amou | H05K 1/0366 442/180 |
| 8,446,734 B2* | 5/2013 | Hayashi | B32B 15/14 361/783 |
| 2004/0234741 A1* | 11/2004 | Hosomi | C08J 5/24 428/292.1 |
| 2010/0065317 A1 | 3/2010 | Okada | |
| 2012/0111621 A1* | 5/2012 | Ohigashi | B32B 15/14 174/258 |
| 2013/0242520 A1 | 9/2013 | Onozuka | |
| 2013/0269989 A1* | 10/2013 | Kim | H05K 1/0366 174/255 |
| 2014/0110153 A1* | 4/2014 | Kashiwagi | C22C 30/02 174/251 |
| 2014/0311781 A1 | 10/2014 | Kishino et al. | |
| 2015/0282302 A1* | 10/2015 | Hoshi | B32B 15/20 174/258 |
| 2015/0366056 A1* | 12/2015 | Matsuda | H05K 1/0373 174/250 |
| 2016/0007453 A1* | 1/2016 | Kawate | H05K 1/038 361/783 |
| 2016/0083535 A1* | 3/2016 | Wilenski | C08J 5/24 442/59 |
| 2016/0090457 A1* | 3/2016 | Umehara | H05K 1/0366 174/258 |

FOREIGN PATENT DOCUMENTS

| | | |
|---|---|---|
| JP | 2011-029410 A | 2/2011 |
| JP | 2015-147912 A | 8/2015 |
| TW | 200849506 A | 12/2008 |

* cited by examiner

PRINTED WIRING BOARD AND SEMICONDUCTOR PACKAGE

CROSS-REFERENCE TO RELATED APPLICATIONS

This application is a U.S. national phase application filed under 35 U.S.C. § 371 of International Application No. PCT/JP2017/040472, filed Nov. 9, 2017, designating the United States, which claims benefit from Japanese Patent Application 2016-219240, filed Nov. 9, 2016, which are hereby incorporated herein by reference in their entirety.

TECHNICAL FIELD

The present invention relates to a printed circuit board and a semiconductor package.

BACKGROUND ART

In view of further simplicity, efficiency, and labor saving, personal goods used in daily life are being electronized, wherein electronic parts used in the electronic equipment are required to be further lighter and smaller in view of the use convenience, etc. Therefore, the printed circuit boards used in the electronic parts, too, is made thinner and smaller so that the circuit pattern is being made finer and the insulating layer is being made thinner. In view of the cost and workability, the parts to be mounted become smaller and the pitch thereof are made narrower, so that a warp of the printed circuit board during the time of mounting thereof can be a serious problem. Therefore, conventionally, in order to reduce the difference between the thermal expansion of a base material before and after the reflow soldering and the thermal expansion of the chip to be mounted, the measures such as raising the glass transition temperature of a resin layer included in the base material and lowering the thermal expansion rate of the resin layer have been used to reduce the warp.

On the other hand, there are wide variety of circuit patterns of the printed circuit board. A circuit pattern is formed on both sides of a laminate by means such as etching, plating or sputtering metal foil. However, as a result, a difference in the amount of metal present on the two sides of the laminate often occurs. Being different in the amount of metal on both sides of the laminate of insulating resin, warps are likely generated as a result. Therefore, several methods such as a method for minimizing warp by setting the heat shrinkage rate of the surface layer opposite to the metal layer to 30 to 90% of the heat shrinkage rate of the substrate layer (see PTL 1), and a method for processing the laminate by fixing it to a rigid supporting plate in advance (see PTL 2) have been proposed.

CITATION LIST

Patent Literature

PTL 1: Japanese Patent Laid-Open Publication No. H07-241957
PTL 2: Japanese Patent Laid-Open Publication No. 2011-29410

SUMMARY OF INVENTION

Technical Problems

However, the method disclosed in PTL 1 is easy to carry out when using a large number of laminated prepregs, while it is difficult to apply when using a thin metal-clad laminate, in particular, in case where the metal-clad laminate comprises only one prepreg. Meanwhile, no problem occurs during the processing in the method disclosed in PTL 2, but there is a problem that a warp may occur when the supporting plate is finally peeled off.

Therefore, the problem of the present invention is to provide a printed circuit board in which warps are effectively suppressed, and a semiconductor package having a semiconductor device mounted on said printed circuit board, even though circuit patterns of different amounts of metal are formed on both sides of one cured product of a prepreg.

Solution to Problems

Inventors of the present invention carried out an extensive investigation in order to solve the problems mentioned above, and as a result, they focused on the stress generated due to the difference in the amount of metal on the front and back which occurs after the circuit pattern is formed, they have found that by taking measures to compensate this stress in the prepreg, any warps can be effectively suppressed even when circuit patterns with different amounts of metal are formed on both sides of one cured product of a prepreg. On the basis of this finding, the present invention could be completed.

Namely, the present invention provides following [1] to [9].

[1] A printed circuit board comprising a cured product of prepreg comprising a fiber base material and a resin composition, in which circuit patterns of different amounts of metal are formed on both sides of one cured product of the prepreg, respectively, in which
said prepreg has layers on the front and back of said fiber base material, wherein said layers comprise resin compositions having different heat curing shrinkage rates, in which among these layers, the layer made of the resin composition having a smaller heat curing shrinkage rate is present on the side on which the circuit pattern with a smaller amount of metal is formed.
[2] The printed circuit board according to [1], wherein the layers comprising the resin compositions having different heat curing shrinkage rates on said each of the front and back of said fiber base material in said prepreg comprising different types of resin compositions.
[3] The printed circuit board according to [1] or [2], wherein the difference between the heat curing shrinkage rates of the resin compositions forming the layers on each of the front and back of said fiber base material is 0.3% or above.
[4] The printed circuit board according to any one of [1] to [3], wherein the difference in the amount of metal between the circuit patterns on both sides is 15% by volume or above.
[5] The printed circuit board according to any one of [1] to [4], wherein said prepreg satisfies a following formula (1) as well as a following formula (2):

$$0.12 < \{(a1+a2)/2\}/B < 0.32 \quad (1)$$

$$0.8 \le a1/a2 \le 1.25 \quad (2)$$

wherein a1 represents an average thickness of the resin composition after being cured which is present on one surface of the fiber base material; a2 represents an average thickness of the resin composition after being cured which is present on other surface of the fiber base material; and B represent an average thickness of the fiber base material.
[6] The printed circuit board according to any one of [1] to [5], wherein the thickness of the prepreg is 30 to 170 μm.

[7] The printed circuit board according to any one of [1] to [6], wherein the stress generated by the difference in the amount of metal of one circuit pattern and the amount of metal of the other circuit pattern on said both sides is compensated by the stress generated by the difference in heat curing shrinkage rates of said resin compositions.

[8] The printed circuit board according to any one of [1] to [7], wherein the amount of the warps, which are measured according to the measurement method described in section 2.4.22.1C of IPC-TM-650, is 60 mm or less.

[9] A semiconductor package comprising a semiconductor device mounted on the printed circuit board according to any one of [1] to [8].

Advantageous Effects of Invention

According to the present invention, a printed circuit board in which warps are effectively suppressed, and a semiconductor package having a semiconductor device mounted on said printed circuit board, even though circuit patterns of different amounts of metal are formed on both sides of one cured product of a prepreg can be provided.

DESCRIPTION OF EMBODIMENTS

The present invention will now be described in detail, but an embodiment in which matters described in the present specification are arbitrarily combined is also included in the present invention.

[Printed Circuit Board]

Figure 2:
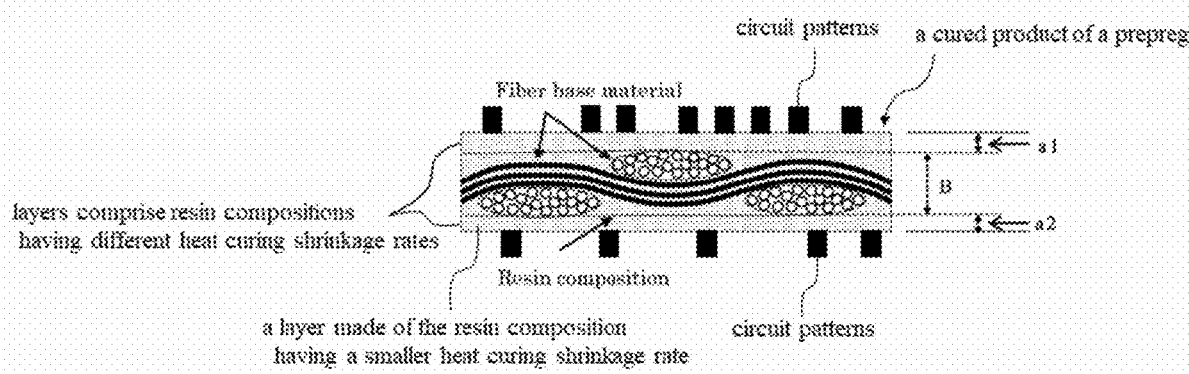
FIG. 2 is a schematic cross section view to explain printed circuit board including a cured product of the prepreg of the present invention.

A printed circuit board according to the present invention, as shown in FIG. 2, comprises a cured product of a prepreg comprising a fiber base material and a resin composition, in which circuit patterns of different amounts of metal are formed on both sides of one cured product of the prepreg, in which said prepreg has layers on the front and back of said fiber base material, wherein said layers comprise resin compositions having different heat curing shrinkage rates, in which among these layers, the layer made of the resin composition having a smaller heat curing shrinkage rate is present on the side on which the circuit pattern with a smaller amount of metal is formed.

Here, the term "amount of metal" means the total amount of metal volume remaining on one side surface after the circuit pattern is formed.

In the printed circuit board, since circuit patterns of different amounts of metal are formed on both sides of one cured product of a prepreg, and said difference causes stress, a large warp tended to occur in the prior art. However, in the present invention, since each of the front and back of the fiber base material has a layer made of a resin composition having different heat curing shrinkage rate, stress is generated due to the difference in heat curing shrinkage rate. It can be considered that the aforementioned two stresses are compensated by existing on the side, on which the circuit pattern of the smaller amount of metal is formed, the layer comprising the resin composition having the smaller heat curing shrinkage rate of the layers comprising resin compositions having different heat curing shrinkage rates, thereby leading the effective reduction of warps of the printed wiring board.

In other words, it is considered that in the printed circuit board according to the present invention, stress caused by the difference between the amount of metal of the circuit pattern on one side of both sides and the amount of metal of the circuit pattern on the other side is compensated by the stress caused by the difference in heat curing shrinkage rate of said resin compositions, thereby effectively reducing any warps.

The printed circuit board according to the present invention can be obtained by forming a circuit pattern on both sides of a metal-clad laminate. Said metal-clad laminate is a metal-clad laminate containing a cured product of a prepreg comprising a fiber base material and a resin composition, and having a metal foil on both sides of one cured product of the prepreg.

The method of forming a circuit pattern on both sides of a metal-clad laminate includes, but specifically limited to known methods such as subtractive method, full additive method, semi additive method (SAP: Semi Additive Process) and modified semi additive method (m-SAP: modified Semi Additive Process).

It is preferable that the metal of the metal foil for the metal-clad laminate comprises copper, gold, silver, nickel, platinum, molybdenum, ruthenium, aluminum, tungsten, iron, titanium, chromium, or an alloy containing at least one of these metal elements. The alloy is preferably a copper-based alloy, an aluminum-based alloy or an iron-based alloy. Examples of the copper-based alloys include copper-nickel alloys and the like. Examples of the iron-based alloys include iron-nickel alloys (42 alloy) and the like. Among these, as the metal, copper, nickel and 42 alloy are more preferable, and copper is even more preferable in view of availability and cost. The thickness of the metal foil is not particularly limited, but may be 3 to 210 μm, preferably 5 to 140 μm.

In addition, the metal foil having a resin layer adapted to electroless copper plating carried out in semi-additive method, etc., instead of a metal foil for critic formation can be placed. The resin composition contained in said resin layer may be described in the same manner as the resin composition as described below, and may be the same as or different from the resin composition described below. The resin composition is not particularly limited, but preferably contains an epoxy resin. The epoxy resin can be described in the same manner as the description below.

The printed circuit board according to the present invention has a warp amount of 60 mm or less, preferably 50 mm or less, even preferably 35 mm or less, when the maximum vertical displacement is measured according to the measurement method described in section 2.4.22.1 C of IPC-TM-650. The lower the warp amount, the more preferable, so the lower limit value of the warp amount is not particularly limited, but in the printed circuit board according to the present invention, the lower limit of the warp amount tends to be 20 mm or 25 mm.

In the printed circuit board according to the present invention, warps can be suppressed to a small amount, even when the difference in the amount of metal of the circuit pattern on both sides of one cured product of the prepreg is 15% by volume or more, or 20% by volume or more, or even 25% by volume or more. In general, when the difference in the amount of metal is 15% by volume or more, distortion tends to occur, furthermore, warps of the printed circuit board is likely to occur. Therefore, it can be said that when the difference in the amount of metal is 15% by volume or more, the effects of the present invention are remarkable. In addition, the upper limit of the difference between the amounts of metal of the circuit patterns of both surfaces of said one cured product of the prepreg is not specifically limited, but preferably to 60% by volume or less, more preferably 50% by volume or less, still more preferably 40% by volume or less, particularly preferably 30% by volume or less, in view of warp suppression.

Here, the term "the difference in the amount of metal" means, for example, when forming a circuit pattern using metal foils of the same volume on the top and the bottom of a prepreg, and assuming that the circuit pattern with the larger amount of metal corresponds to A % by volume of the metal foil before the formation of the circuit patter, and the circuit pattern with less amount of metal corresponds to B % by volume of the metal foil before the formation of the circuit pattern, said difference can be obtained by A-B.

Said prepreg has the layer which comprises a resin composition which has a different heat curing shrinkage rate on each of the front and back of the said fiber base material as mentioned above. Here, regarding the term "the front and back" of the fiber base material, either side of the fiber base material may be front or back, and not restricted to this point.

It is preferable that by using an embodiment where types of resin compositions for each of the front and back of the fiber base material are different from each other, the resin compositions have different heat curing shrinkage rates from each other, or that by using another embodiment where the contents of inorganic filler and the like are changed, the resin compositions have different heat curing shrinkage rates from each other. The term "types of resin compositions are different from each other" means that the type of at least one of the components of the resin composition is different.

When the heat curing shrinkage rate of the resin composition for each of the front and back of the fiber base material is different, it is possible to compensate the stress caused by the difference in the amount of metal on the front and back that occurs after the formation of the circuit pattern. The type of resin composition is not particularly limited, and any combination of various resin compositions can be employed, but it is preferable to combine the resin compositions such that the difference in heat curing shrinkage rate of said resin compositions on the front and back of said fiber base material is 0.3% or above, preferably 0.3 to 0.6%, more preferably 0.4 to 0.6%, and even more preferably 0.4 to 0.55%.

<Prepreg>

Figure 1:
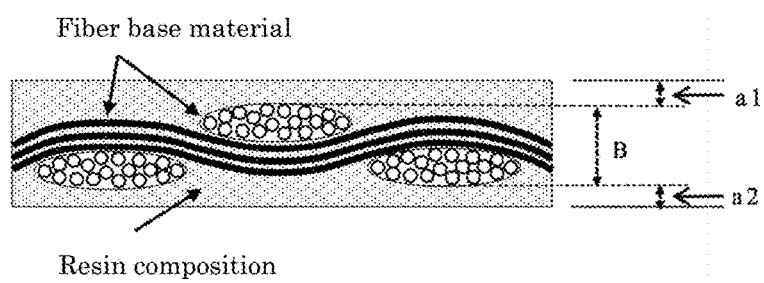
FIG. 1 is a schematic cross section view to explain the prepreg which may be used in the present invention.

It is preferable that the prepreg which can be used in the preparation of the printed circuit board according to the present invention is of the prepreg which satisfies the following formula (1) and formula (2).

$$0.12 < \{(a1+a2)/2\}/B < 0.32 \quad (1)$$

$$0.8 \leq a1/a2 \leq 1.25 \quad (2)$$

Wherein a1 in the above formula (1) and formula (2) represents the average thickness of the resin composition present on one of the surfaces of the fiber base material after curing, and a2 represents the average thickness of the resin composition present on the other surface of the fiber base material after curing. B represents the average thickness of the fiber base material (see FIG. 1).

The measurement methods of a1, a2, and B are not necessarily restricted; however, in the present invention, the values obtained by the methods described below are employed.

(Measurement Methods of a1, a2, and B)

While a prepreg is being hung down in a dryer, temperature of the dryer is raised from 20° C. to 160° C. at the rate of 5° C./hour, then the specimen being kept at 160° C. for 30 minutes is put in a vessel while it is aligned with a thickness tape having a thickness of 0.01 mm measured in accordance with JIS B7524 (2008) [leaf shape: A type].

Next, 100 parts by mass of a bisphenol A liquid epoxy resin and 10 parts by mass of trimethyl tetramine are poured into the vessel with stirring. After having been degassed at the vacuum degree of 700 mmHg (93.3 kPa) for 3 minutes, the resin is cured at 40° C. for 60 minutes and then at 60° C. for 90 minutes. After having been cured, the cured product is taken out from the vessel, and it is cut and mechanically polished to expose the cross section thereof, which is then observed with a scanning electron microscope (SEM) to measure the thickness of the resin composition which is present on one surface of the fiber base material, the thickness of the resin composition which is present on other surface of the fiber base material, and the thickness of the fiber base material.

Measurements are made at 10 portions not having clear scar, dent, or fracture; and an average value thereof is obtained for each of a1 (measured value), a2 (measured value), and B (measured value), which are then corrected as follows to obtain each of a1 (corrected value), a2 (corrected value), and B (corrected value), whereby these values are used as a1, a2, and B in the formulae (1) and (2).

—Correction Method—

The thickness tape having the thickness of 0.01 mm is also observed with a scanning electron microscope (SEM), and the thickness thereof is similarly measured at 10 portions, and thereby the average value thereof is obtained. By using the measured average value and 0.01 mm, the correction coefficient $\alpha$ is obtained by the following formula (3). By multiplying this correction coefficient $\alpha$ to each of a1 (measured value), a2 (measured value), and B (measured value), each of a1 (corrected value), a2 (corrected value), and B (corrected value) is obtained.

$$\alpha = 0.01 \text{ mm/measured average thickness value of thickness tape} \quad (3)$$

a1 (corrected value)=a1 (measured value)×$\alpha$ a2 (corrected value)=a2 (measured value)×$\alpha$ B (corrected value)=B (measured value)×$\alpha$ The above correction is made in order to correct the shift of the measured value from the true value, the shift being caused when the prepreg is not cut and mechanically polished perpendicularly to the measuring plane.

Meanwhile, the thickness tape is available from Tokyo Thickness Corp.

The bisphenol A liquid epoxy resin can be expressed by the following formula (I).

[Chem. 1]

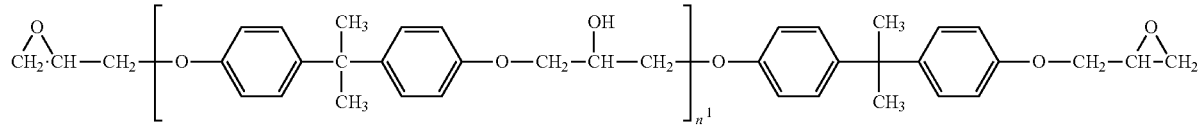

(I)

In the formula (I), $n^1$ represents an integer of 0 to 3, preferably an integer of 0 to 2, while more preferably 0 or 1.

The epoxy equivalent of said bisphenol A liquid epoxy resin is preferably 150 to 500 g/eq, more preferably 150 to 400 g/eq, while still more preferably 150 to 250 g/eq. Meanwhile, the epoxy equivalent is the mass of the resin per the epoxy group (g/eq), which can be measured by the method stipulated in JIS K 7236 (2009); the same applies hereafter. Specifically the automatic titration apparatus "GT-200 Type" (manufactured by Mitsubishi Chemical Analytech Co., Ltd.) is used, wherein 90 mL of methyl ethyl ketone is dropped into 2 g of an epoxy resin weighed into a 200 mL beaker; and after the resin is dissolved by an ultrasonic cleaner, 10 mL of glacial acetic acid and 1.5 g of cetyl trimethyl ammonium bromide were added to it, and then, this solution is titrated with 0.1 mol/L of a perchloric acid/acetic acid solution to obtain the epoxy equivalent.

With regard to said bisphenol A liquid epoxy resin, a commercially available product such as "jER (registered trade mark) 815" (manufactured by Mitsubishi Chemical Corp.) may be cited.

The average thickness B of the fiber base material is preferably 5 to 120 μm, more preferably 5 to 100 μm, still more preferably 10 to 100 μm, may be 10 to 50 μm, may be 10 to 30 μm.

The formula (1) is a rough indication of the ratio of the average value of the average thicknesses of the resin composition after being cured which is present in the front and back sides of the fiber base material [(front side average thickness a1+back side average thickness a2)/2] to the fiber base material's average thickness (B). Meanwhile, the front and back sides are not particularly restricted, so that any side may be considered as the front side; the same applies hereafter.

When the ratio of the average value of the average thicknesses of the resin composition after being cured which is present in the front and back sides of the fiber base material to the entire prepreg is above the predetermined value, the cure shrinkage of the resin composition which is present in the front and back sides of the fiber base material has a large effect to the warp of the substrate; therefore, in order to set the condition that causes this problem, the value of {(a1+a2)/2}/B in the formula (1) is set to more than 0.12. When this condition is satisfied, it becomes necessary to effectively reduce the warp, and the effects of the present invention become even more beneficial. When said value is less than 0.32, the amount of powder to drop off the prepreg can be reduced.

It is preferable that the prepreg to be used in the present invention satisfy the following formula (2'), though not particularly limited to this.

$$0.9 \leq a1/a2 \leq 1.15 \quad (2')$$

The formulae (2) and (2') specify the ratio of the average thickness of the resin composition after being cured which is present on one (front) surface of the fiber base material to the average thickness of the resin composition after being cured which is present on the other (back) surface of the fiber base material, meaning that the difference between the average thicknesses thereof is small.

Hereunder, the fiber base material and the resin composition which are included in the prepreg will be explained.

[Fiber Base Material]

With regard to the fiber base material, any known materials used in various laminates for electric insulation material can be used. Illustrative example of the fiber base material includes natural fibers such as paper and cotton linter; inorganic fibers such as glass fibers and asbestos; organic fibers such as cellulose, aramid, polyimides, polyvinyl alcohol, polyesters, tetrafluoroethylene, and acryls; and mixtures of them. Among them, in view of flame retardant property, a glass cloth is preferable. Illustrative example of the glass cloth includes a glass cloth using E glass, C glass, D glass, S glass, and the like, or a glass cloth having short fibers bonded with an organic binder; and a mixed fabric of glass fibers and cellulose fibers. More preferable is the glass cloth using E glass.

These fiber base materials have the form of woven fabric, unwoven fabric, roving, chopped strand mat, surfacing mat, or the like. Meanwhile, the material and form thereof are chosen depending on the use or performance of the target shaped material, wherein they may be used singly or, if necessary, in a combination of two or more of the material and form thereof.

The two or more of the material and form of the fiber base material may be the same or different with each other. Meanwhile, when two or more of the fiber base material are used, the aforementioned average thickness B of the fiber base material is a sum of the average thicknesses of the two or more of the fiber base material.

The fiber base material is not particularly restricted, whereas the fiber base material formed of one layer may be used in view of making it thinner. Meanwhile, the fiber base material formed of one layer means the fiber base material formed of only the entangled fibers; and when the fiber base material not been entangled is present, this is classified to the fiber base material formed of multilayers.

[Resin Composition]

The resin composition is attached to the fiber base material in the prepreg, wherein the resin composition is incorporated into the fiber base material as well as present on the surface of the fiber base material. In the present invention, the layer comprising the resin compositions of "front and back of the fiber base material" indicate the resin compositions present on the surfaces of the fiber base material, and the thickness of these resin compositions after curing are the thicknesses indicated by a1 and a2 in FIG. 1.

It is preferable that the resin composition includes a thermosetting resin. Besides the thermosetting resin, the resin composition may include, if so desired, a curing agent, a curing facilitator, an inorganic filler, an organic filler, a coupling agent, a levelling agent, an anti-oxidant, a flame retardant, a flame retardant adjuvant, a thixotropic agent, a thickener, thixotropy-imparting agent, a flexible material, a surfactant, a photo-polymerization initiator, etc.; and it is preferable to include at least any one selected from the group consisting of these materials.

Hereunder, each component included in the resin composition will be explained in order.

(Thermosetting Resin)

With regard to the thermosetting resin, the thermosetting resin having the melt viscosity thereof changeable with its cure degree in an arbitrary temperature range is preferable. Illustrative example of the thermosetting resin includes an epoxy resin, a phenol resin, a poly imide resin, a cyanate resin, an isocyanate resin, a benzoxazine resin, an oxetane resin, an amino resin, an unsaturated polyester resin, an allyl resin, a dicyclopentadiene resin, a silicone resin, a triazine resin, and a melamine resin. In addition, not particularly limited to the above-mentioned resins, heretofore known thermosetting resins may be used. These may be used singly or concurrently as a mixture of two or more of them. Among them, an epoxy resin and a polyimide resin are preferable in view of a molding property as well as an electric insulating property.

Illustrative example of the epoxy resin includes a cresol novolak epoxy resin, a phenol novolak epoxy resin, a naphthol novolak epoxy resin, an aralkyl novolak epoxy resin, a biphenyl novolak epoxy resin, a bisphenol A epoxy resin, a bisphenol F epoxy resin, a bisphenol S epoxy resin, a bisphenol T epoxy resin, a bisphenol Z epoxy resin, a tetrabromobisphenol A epoxy resin, a biphenyl epoxy resin, a tetramethyl biphenyl epoxy resin, a triphenyl epoxy resin, a tetraphenyl epoxy resins, a naphthol aralkyl epoxy resin, a naphthalenediol aralkyl epoxy resin, a naphthol aralkyl epoxy resin, a fluorene epoxy resin, an epoxy resin having a dicyclopentadiene skeleton, an epoxy resin having a skeleton of an ethylenic unsaturated group, and an alicyclic epoxy resin.

With regard to the epoxy resin, in view of flame retardant property, a halogenated epoxy resin may also be used. These epoxy resins may be used singly, or in view of insulating reliability and heat resistance, concurrently as a mixture of two or more of them.

The epoxy equivalent of the epoxy resin is not particularly restricted; however, in view of the heat resistance, the epoxy equivalent is preferably 60 to 400 g/mol, more preferably 70 to 300 g/mol, while still more preferably 80 to 250 g/mol.

Illustrative example of the epoxy resin commercially available includes: as the cresol novolak epoxy resin, "EPICLON (registered trade mark) N-660" (manufactured by DIC Corp.); as the phenol novolak epoxy resin, "EPICLON (registered trade mark) N-770" (manufactured by DIC Corp.); and as the bisphenol A epoxy resin, "EPICLON (registered trade mark) 840S" (manufactured by DIC Corp.); "jER 828EL" and "YL 980" (both manufactured by Mitsubishi Chemical Corp.).

Meanwhile, the epoxy resin is not particularly restricted; however, in order to impart flexibility, the epoxy resin which has two or more epoxy groups in its molecular formula as well as in its main chain a structural unit derived from an alkylene glycol having three or more carbon atoms may also be used. In order to further increase the flexibility, two or more of the structural unit derived from the alkylene glycol having three or more carbon atoms may be continuously repeated.

With regard to the alkylene glycol having three or more carbon atoms, an alkylene glycol having four or more carbon atoms is preferable. The upper limit of the number of the carbon atom is not particularly limited, but it is preferably 15 or less, more preferably 10 or less, while still more preferably 8 or less.

In addition, in view of a flame retardant property a halogenated epoxy resin may also be used as the epoxy resin.

With regard to the polyimide resin, a maleimide compound and the like may be cited. With regard to the maleimide compound, a compound having at least two N-substituted maleimide groups in the molecular formula thereof or modifications thereof is preferable. In view of solubility into an organic solvent and mechanical strength, the weight-average molecular weight (Mw) of the maleimide compound is preferably 400 to 5,000, more preferably 500 to 3,000, while still more preferably 700 to 1,500.

With regard to the maleimide compound, a maleimide compound having an aliphatic hydrocarbon group between two arbitrary maleimide groups among plural maleimide groups, or a maleimide compound having an aromatic hydrocarbon group between two arbitrary maleimide groups among plural maleimide groups (hereunder, this is called "the aromatic hydrocarbon group-containing maleimide") may be cited. Among them, the aromatic hydrocarbon group-containing maleimide is preferable in view of a heat resistance, a dielectric property, a glass transition temperature, a thermal expansion coefficient, and a molding property. With regard to the aromatic hydrocarbon group-containing maleimide, it suffices only if the aromatic hydrocarbon group is present between any two maleimide groups selected with an arbitrarily combination thereof.

The maleimide compound is preferably the aromatic hydrocarbon group-containing maleimide compound, or its modification, represented by the following general formula (II).

[Chem. 2]

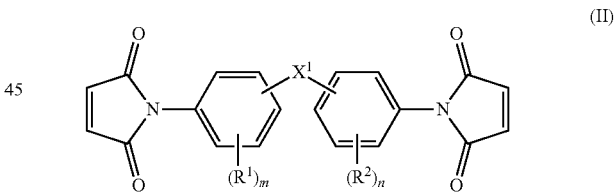

(II)

(In the formula, $R^1$ and $R^2$ each independently represent an aliphatic hydrocarbon group having 1 to 5 carbon atoms or a halogen atom. $X^1$ represents an alkylene group having 1 to 5 carbon atoms, an alkylidene group having 2 to 5 carbon atoms, —O—, —C(=O)—, —S—, —S—S—, or a sulfonyl group. And m and n each independently represent an integer of 0 to 4.)

Illustrative example of the aliphatic hydrocarbon group having 1 to 5 carbon atoms represented by $R^1$ and $R^2$ includes a methyl group, an ethyl group, an n-propyl group, an isopropyl group, an n-butyl group, an isobutyl group, a t-butyl group, and an n-pentyl group. In view of a heat resistance, a dielectric property, a glass transition temperature, a thermal expansion coefficient, and a molding property, the aliphatic hydrocarbon group is preferably an aliphatic hydrocarbon group having 1 to 3 carbon atoms, while more preferably a methyl group and an ethyl group.

Illustrative example of the halogen atom represented by $R^1$ and $R^2$ includes a fluorine atom, a chlorine atom, a bromine atom, and an iodine atom.

Illustrative example of the alkylene group having 1 to 5 carbon atoms represented by $X^1$ includes a methylene group, a 1,2-dimethylene group, a 1,3-trimethylene group, a 1,4-tetramethylene group, and a 1,5-pentamethylene group. In view of a heat resistance, a dielectric property, a glass transition temperature, a thermal expansion coefficient, and a molding property, the alkylene group is preferably an alkylene group having 1 to 3 carbon atoms, while more preferably a methylene group.

Illustrative example of the alkylidene group having 2 to 5 carbon atoms represented by $X^1$ includes an ethylidene group, a propylidene group, an isopropylidene group, a butylidene group, an isobutylidene group, a pentylidene group, and an isopentylidene group. Among them, in view of a heat resistance, a dielectric property, a glass transition temperature, a thermal expansion coefficient, and a molding property, an isopropylidene group is preferable.

Among the above options, $X^1$ is preferably the alkylene group having 1 to 5 carbon atoms and the alkylidene group having 2 to 5 carbon atoms, while more preferably the alkylene group having 1 to 5 carbon atoms. A still more preferable group is the one mentioned before.

With respect to the modified maleimide compounds, it is more preferable that they are maleimide compounds modified by a monoamine compound and a diamine compound, those having an acidic substituent.

Illustrative example of the acidic substituent of the monoamine compound having an acidic substituent includes a hydroxyl group, a carboxylic group, and a sulfonic acid group, whereas a hydroxyl group is preferable.

Illustrative example of the monoamine compound having an acidic substituent includes o-aminophenol, m-aminophenol, p-aminophenol, o-aminobenzoic acid, m-aminobenzoic acid, p-aminobenzoic acid, o-aminobenzenesulfonic acid, m-aminobenzenesulfonic acid, and p-aminobenzenesulfonic acid, 3,5-dihydroxyaniline, and 3,5-dicarboxyaniline. Among them, in view of solubility and reactivity, m-aminophenol, p-aminophenol, p-aminobenzoic acid, and 3,5-dihydroxyaniline are preferable; and in view of a heat resistance, o-aminophenol, m-aminophenol, and p-aminophenol are preferable. As the monoamine compound having an acidic substituent, m-aminophenol may be selected among them.

With regard to the diamine compound, a diamine compound having at least two benzene rings is preferable, a diamine compound having at least two benzene rings in a straight chain between two amino groups is more preferable, while a diamine compound represented by the following general formula (III) is still more preferable.

[Chem. 3]

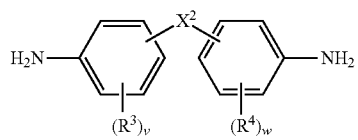

(III)

(In the formula, $X^2$ represents a single bond, an alkylene group having 1 to 5 carbon atoms, an alkylidene group having 2 to 5 carbon atoms, —O—, a sulfonyl group, —C(=O)—, a fluorenylene group, or a phenylene dioxy group. $R^3$ and $R^4$ each independently represent an alkyl group having 1 to 5 carbon atoms, an alkoxy group having 1 to 5 carbon atoms, a halogen atom, a hydroxyl group, a carboxyl group, or a sulfonic acid group. And, v and w each independently represent an integer of 0 to 4.)

Illustrative example of the alkylene group having 1 to 5 carbon atoms represented by $X^2$ includes a methylene group, an ethylene group, a propylene group, and a propylidene group. Among the alkylene groups, an alkylene group having 1 to 3 carbon atoms is preferable, while a methylene group is more preferable.

Illustrative example of the alkylidene group having 2 to 5 carbon atoms represented by $X^2$ includes an ethylidene group, a propylidene group, an isopropylidene group, a butylidene group, an isobutylidene group, a pentylidene group, and an isopentylidene group. Among the alkylidene groups, an isobutylidene group is preferable.

$X^2$ is preferably a single bond, an alkylene group having 1 to 5 carbon atoms, and —O—, while a single bond is more preferable.

Illustrative example of the alkyl group having 1 to 5 carbon atoms represented by $R^3$ and $R^4$ includes a methyl group, an ethyl group, an n-propyl group, an isopropyl group, an n-butyl group, an isobutyl group, a t-butyl group, and an n-pentyl group. The alkyl group is preferably an alkyl group having 1 to 3 carbon atoms, while a methyl group is more preferable.

Illustrative example of the alkoxy group having 1 to 5 carbon atoms represented by $R^3$ and $R^4$ includes a methoxy group, an ethoxy group, and a propoxy group. The alkoxy group is preferably a methoxy group.

Illustrative example of the halogen atom represented by $R^3$ and $R^4$ includes a fluorine atom, a chlorine atom, a bromine atom, and an iodine atom.

Further, v and w each independently represent preferably an integer of 0 to 2, more preferably 0 or 1, while still preferably 1.

Illustrative example of the diamine compound includes 3,3'-dimethyl-4,4'-diamino-1,1'-biphenyl(o-tolidine) and 2,2'-dimethyl-4,4'-diamino-1,1'-biphenyl. Among them, 3,3'-dimethyl-4,4'-diamino-1,1'-biphenyl(o-tolidine) is preferable.

(Curing Agent)

With regard to the curing agent, in the case where the thermosetting resin is the epoxy resin, illustrative example of the curing agent for the epoxy resin includes a phenol type curing agent, a cyanate type curing agent, an acid anhydride type curing agent, an amine type curing agent, and an active ester group-containing compound. Meanwhile, in the case where the thermosetting resin is other than the epoxy resin, curing agents heretofore known for the said thermosetting resin may be used. These curing agents may be used singly or concurrently as a mixture of two or more of them.

With regard to the phenol type curing agent, there is no particular restriction, whereas the preferable, illustrative example thereof includes a cresol novolak type curing agent, a biphenyl type curing agent, a phenol novolak type curing agent, a naphthylene ether type curing agent, and a phenol type curing agent having a triazine skeleton.

The hydroxyl equivalent of the phenol type curing agent is not particularly restricted; however, it is preferably 80 to 150 g/eq, more preferably 80 to 130 g/eq, while still more preferably 90 to 120 g/eq from the viewpoint of crosslink density.

Illustrative example of the phenol type curing agent commercially available includes: as the cresol novolak type curing agent such as KA-1160, KA-1163, KA-1165 (all manufactured by DIC Corp.); as the biphenyl type curing agent such as MEH-7700, MEH-7810, MEH-7851 (all manufactured by Meiwa Plastic Industries, Ltd.); as the phenol novolak type curing agent such as Phenolite (registered trade mark) TD2090 (manufactured by DIC Corp.); as the naphthylene ether type curing agent such as EXB-6000 (manufactured by DIC Corp.); and as the phenol type curing agent having a triazine skeleton such as LA3018, LA7052, LA7054, LA1356 (all manufactured by DIC Corp.).

With regard to the cyanate type curing agent, there is no particular restriction, whereas illustrative example thereof includes bisphenol A dicyanate, polyphenol cyanate [oligo(3-methylene-1,5-phenylenecyanate)], 4,4'-methylenebis(2,6-dimethylphenylcyanate), 4,4'-ethylidene diphenyl dicyanate, hexafluorobisphenol A dicyanate, 2,2-bis(4-cyanate)phenylpropane, 1,1-bis(4-cyanatephenylmethane), bis(4-cyanate-3,5-dimethylphenyl)methane, 1,3-bis(4-cyanatephenyl-1-(methylethylidene))benzene, bis(4-cyanatephenyl) thioether, and bis(4-cyanatephenyl) ether.

With regard to the acid anhydride type curing agent, there is no particular restriction, whereas illustrative example thereof includes phthalic anhydride, tetrahydrophthalic anhydride, hexahydrophthalic anhydride, methyl tetrahydrophthalic anhydride, methyl hexahydrophthalic anhydride, methyl nadic anhydride, hydrogenated methyl nadic anhydride, trialkyl tetrahydrophthalic anhydride, dodecenyl succinic anhydride, 5-(2,5-dioxotetrahydro-3-furanyl)-3-methyl-3-cyclohexene-1,2-dicarboxylic anhydride, trimellitic anhydride, and pyromellitic anhydride.

With regard to the amine type curing agent, there is no particular restriction, whereas illustrative example thereof includes aliphatic amines such as triethylene tetramine, tetraethylene pentamine, and diethylaminopropylamine; and aromatic amines such as m-phenylene diamine and 4,4'-diaminodiphenylmethane.

In addition, a urea resin, etc., may also be used as the curing agent.

When the heat curing shrinkage rate should be increased, it is preferable to use a curing agent having large steric hindrance, for example, it is preferable to use phenolic novolac resin, cresol novolac resin, or phenol novolac resin or cresol novolac resin having an aminotriazine structure and the like.

When the resin composition includes the curing agent, the content thereof is preferably 10 to 150 parts by mass, more preferably 10 to 100 parts by mass, while still more preferably 10 to 50 parts by mass, relative to 100 parts by mass of the thermosetting resin.

Meanwhile, when the resin composition includes the curing agent, the content thereof may also be expressed by the equivalent of the functional group thereof, while it is preferable to do so. Specifically, the curing agent is included therein preferably such that (mass of thermosetting resin/equivalent of functional group) is nearly equal to (mass of curing agent/equivalent of thermosetting resin-reactive functional group)×(constant C). The constant C is different depending on the functional group of the curing agent, wherein in the case where the functional group is a phenolic hydroxyl group, it is preferably 0.8 to 1.2; in the case of an amino group, it is preferably 0.2 to 0.4; and in the case of an active ester group, it is preferably 0.3 to 0.6.

In the case where the thermosetting resin is the epoxy resin, the foregoing equation is expressed such that (mass of epoxy resin/equivalent of epoxy group) is nearly equal to (mass of curing agent/equivalent of epoxy-reactive functional group)×(constant C).

(Curing Facilitator)

With regard to the curing facilitator, curing facilitators generally used for curing of the thermosetting resin may be used. For example, in the case where the thermosetting resin is the epoxy resin, illustrative example of the curing facilitator includes: an imidazole compound and a derivative thereof a phosphorous compound; a tertiary amine compound; and a quaternary ammonium compound. In view of facilitation of the curing reaction, an imidazole compounds and a derivative thereof are preferable. Illustrative example of the derivative of the imidazole compound includes an imidazoline compound, or an imidazole compound in which the secondary amino group is masked with acrylonitrile, isocyanate, melamine, acrylate or the like to have a potential.

Specific example of the imidazole compound and the derivative thereof includes: imidazole compounds such as 2-methylimidazole, 2-ethylimidazole, 2-undecylimidazole, 2-heptadecylimidazole, 2-phenylimidazole, 1,2-dimethylimidazole, 2-ethyl-1-methylimidazole, 1,2-diethyl imidazole, 1-ethyl-2-methylimidazole, 2-ethyl-4-methylimidazole, 4-ethyl-2-methylimidazole, 1-isobutyl-2-methylimidazole, 2-phenyl-4-methylimidazole, 1-benzyl-2-phenylimidazole, 1-cyanoethyl-2-methylimidazole, 1-cyanoethyl-2-ethylimidazole, 1-cyanoethyl-2-phenylimidazole, 1-cyanoethyl-2-ethyl-4-methylimidazole, 2-phenyl-4,5-dihydroxymethylimidazole, 2-phenyl-4-methyl-5-hydroxymethylimidazole, 2,3-dihydro-1H-pyrro[1,2-a]benzimidazole, 2,4-diamino-6-[2'-methylimidazolyl-(1')]ethyl-s-triazine, 2,4-diamino-6-[2'-undecylimidazolyl-(1')]ethyl-s-triazine, and 2,4-diamino-6-[2'-ethyl-4'-methylimidazolyl-(1')]ethyl-s-triazine; imidazoline compounds such as 2-methylimidazoline, 2-ethyl-4-methylimidazoline, 2-undecylimidazoline, 2-phenyl-4-methylimidazoline; addition reaction products of the above-mentioned imidazole compounds (preferably, 1-cyanoethyl-2-phenylimidazolium trimellitate) with trimellitic acid; addition reaction products of the above-mentioned imidazole compounds with isocyanuric acid; addition reaction products of the above-mentioned imidazole compounds (preferably, 2-ethyl-4-methylimidazole) with diisocyanate compounds (preferably, hexamethylene diisocyanate); and addition reaction products of the above-mentioned imidazole compounds with hydrobromic acid. These imidazole compounds may be used singly or concurrently as a mixture of two or more of them.

Among them, as a curing facilitator, 2-ethyl-4-methylimidazole, the addition reaction product of imidazole compound with diisocyanate compound are preferable, and 2-ethyl-4-methylimidazole, and the addition reaction product of 2-ethyl-4-methylimidazole with hexamethylene diisocyanate are more preferable.

When the resin composition includes the curing facilitator, the content thereof is preferably 0.05 to 20 parts by mass, more preferably 0.05 to 10 parts by mass, while still more preferably 0.1 to 4 parts by mass, relative to 100 parts by mass of the thermosetting resin.

(Inorganic Filler)

By using an inorganic filler, the thermal expansion rate can be decreased, and the film strength can be enhanced. In addition, a non-transmitting property to a light and an abrasion resistance can be enhanced as well. Besides, this is occasionally added in order to increase the volume of the resin composition.

Illustrative example of the inorganic filler includes: oxides such as silica, aluminum oxide, zirconia, mullite, and magnesia; hydroxides such as aluminum hydroxide, magnesium hydroxide, and hydrotalcite; nitride ceramics such as aluminum nitride, silicon nitride, and boron nitride; and natural minerals such as talc, montmorillonite, and saponite, wherein at least any one selected from the group consisting of these inorganic fillers is preferably used. Among them, silica, alumina, and aluminum hydroxide are preferable, while silica and aluminum hydroxide are more preferable.

With regard to the silica, precipitated silica with high water content which is produced with a wet method and dry silica hardly including bound water, etc., which is produced with a dry method may be cited. With regard to the dry silica, depending on difference in the production method thereof, crushed silica, fumed silica, and fused silica (fused spherical silica) may be cited.

The inorganic filler may be treated in the surface thereof with a surface modifying agent such as a silane coupling agent in order to enhance the moisture resistance thereof, and also it may be treated with an agent to make it hydrophobic in order to enhance the dispersion property thereof.

The inorganic filler can be selected appropriately in accordance with the purpose thereof. In view of easiness in forming a fine circuit, specific surface area of the inorganic filler is preferably 1 to 50 $m^2/g$, more preferably 1 to 30 $m^2/g$, while still more preferably 1 to 15 $m^2/g$. The specific surface area of the inorganic filler can be obtained with a measurement method usually used by a person skilled in the art, for example, with a BET method. In the BET method, a molecule whose adsorption occupied area is known is adsorbed onto the powder particle surface at the liquid nitrogen temperature so that the specific surface area of the sample is obtained from the amount thereof. The most frequently used method in the specific surface area analysis is the BET method using an inert gas such as nitrogen.

The average primary particle's diameter of the inorganic filler is preferably 0.1 to 50 μm, more preferably 0.1 to 30 μm, while still more preferably 0.1 to 10 μm. Meanwhile, "average primary particle's diameter" means the average particle's diameter of the single particle not aggregated, in other words it does not mean the average diameter of the aggregated particle, namely not the secondary particle's diameter. The average primary particle's diameter can be obtained by measurement with a laser diffraction particle size distribution analyzer. The average primary particle's diameter is the particle's diameter at the volume of 50% in the cumulative frequency distribution curve of the particle's diameter in which total volume of the particle is taken as 100%.

When the resin composition includes the inorganic filler, the content thereof is preferably 1 to 65% by mass, more preferably 10 to 60% by mass, while still more preferably 25 to 50% by mass, relative to total components of the resin composition (however, an organic solvent is excluded). When the content is 65% or less by mass, viscosity of the resin composition can be kept low so that the workability is enhanced.

Meanwhile, specific gravity of the inorganic filler is wider from small to large as compared with the resin components, so that the content thereof (% by mass) may be expressed with converting it to "% by volume", which takes the specific gravity into account. Namely, it can be said that the content of the inorganic filler is preferably 0.1 to 65% by volume, though different depending on the purpose of addition. For the purposes of coloring and non-transmittance of a light, the amount of 0.1% or more by volume is prone to express sufficient effect. On the other hand, for the purpose to increase the volume, when the volume thereof is kept in the level of 65% or lower by volume, the viscosity during the time of blending of the resin components can be kept not too high, so that the decrease in workability is prone to be easily suppressed. From the same view point, the content of the inorganic filler is more preferably 10 to 60% by volume, while still more preferably 25 to 50% by volume.

(Organic Solvent)

In view of handling easiness, the resin composition may include an organic solvent. In this specification, the resin composition including an organic solvent is sometimes called a resin varnish. Provided that, if there is no characteristic problem, it is possible to employ powder mixing in which the respective components are powdered and mixed, it is also possible to employ the preparation of aqueous solutions by suspension etc., or it is also possible to employ a method for directly mixing every component at a temperature where the curing reaction does not significantly progress and at a temperature where the resin component liquefies.

The organic solvent is not particularly restricted, wherein illustrative example thereof includes: alcoholic solvents such as methanol, ethanol, propanol, butanol, methyl cellosolve, butyl cellosolve, propylene glycol monomethyl ether, ethylene glycol monoethyl ether, dipropylene glycol monomethyl ether, dipropylene glycol monoethyl ether, and tripropylene glycol monomethyl ether; ketonic solvents such as acetone, methyl ethyl ketone, methyl isobutyl ketone, butanone, cyclohexanone, and 4-methyl-2-pentanone; ester solvents such as ethyl acetate, butyl acetate, and propylene glycol monomethyl ether acetate; ether solvents such as tetrahydrofuran; aromatic solvents such as toluene, xylene, and mesitylene; nitrogen atom-containing solvents such as N,N-dimethylformamide, N,N-dimethylacetamide, and N-methyl pyrrolidone; and sulfur atom-containing solvents such as dimethyl sulfoxide. Among them, in view of solubility and appearance after the application, ketonic solvents are preferable, wherein cyclohexanone, methyl ethyl ketone, and methyl isobutyl ketone are more preferable, while methyl ethyl ketone is still more preferable.

These organic solvents may be used singly or concurrently as a mixture of two or more of them.

In view of coating easiness, use amount of the organic solvent is controlled, for example, such that content of non-volatile components (these are sometimes called solid components) in the resin composition is preferably 20 to 85% by mass, while more preferably 40 to 80% by mass.

(Preparation Method of Resin Composition)

There is no particular restriction in the preparation method of the resin composition (resin varnish), so that heretofore known methods may be used.

For example, after the above-mentioned components each are added into the organic solvent, they are stirred and mixed by using various mixing machines to prepare the resin composition. Illustrative example of the type of the mixing machine includes an ultrasonic dispersion type, a high-pressure collision dispersion type, a high-speed rotation dispersion type, a bead mill type, a high-speed shearing dispersion type, and a planetary centrifugal dispersion type.

(Production Method of Prepreg)

There is no particular restriction in the production method of the prepreg, so that heretofore known methods for producing the prepreg may be used. For example, the prepreg can be produced in such a way that after the resin composition is impregnated into or applied to the fiber base material, this is subjected to heating or the like so as to be semi-cured (converted to B-stage).

Because the organic solvent is simultaneously removed with curing, the heating temperature upon semi-curing thereof (conversion to B-stage) is equal to or higher than a boiling point of an organic solvent since in this temperature the organic solvent can be efficiently removed; therefore, specifically the temperature is preferably 80 to 200° C., while more preferably 140 to 180° C. Meanwhile, in the present invention, the prepreg obtained by further cured (conversion to C-stage) after obtaining the prepreg by semi-curing (conversion to B-stage) is regarded as the cured product of the prepreg.

In the alternative production method of the prepreg, for example, after the resin composition is applied onto a releasing film, the resin composition is semi-cured (converted to B-stage) by heating or the like so as to make it to a film form, and then this resin film is laminated to the fiber base material. In view of easiness in satisfying the formula (2), this method is more preferable.

In application of the resin composition, heretofore known coating machines such as a die coater, a comma coater, a bar coater, a kiss coater, and a roll coater may be used. These coating machines may be appropriately chosen in accordance with the intended thickness of the resin film.

With regard to the lamination method, among others, a method in which the resin composition is laminated to the fiber base material under reduced pressure by a roll lamination method, a vacuum lamination method, or the like may be cited. Condition of the pressure roll lamination is, for example, the heating temperature of 50 to 150° C. and the pressure of 0.1 to 1.0 MPa/m, and lamination rate of 0.5 to 4 m/min. Condition of the vacuum lamination is, for example, the heating temperature of 50 to 150° C., the vacuum time of 5 to 40 seconds, the pressing time of 10 to 120 seconds, and the pressure of 0.1 to 0.5 MPa.

Illustrative example of the releasing film includes: organic films such as polyethylene terephthalate (PET), biaxially drawn polypropylene (OPP), polyethylene, polyvinyl fluoride, polyimide and polyamide imide (PAI); metal films such as copper and aluminum, or alloy films of these metals; and these organic or metal films whose surface is treated with a release treatment by a releasing agent. These releasing films may be those which are release-treated with a releasing agent.

Thickness of the entire prepreg may be appropriately controlled in accordance with the thickness of the inner circuit, etc.; however, in view of the molding property and workability, the thickness is preferably 10 to 700 μm, more preferably 10 to 500 μm, still more preferably 20 to 250 μm, particularly preferably 30 to 170 μm, while most preferably 30 to 130 μm.

[Semiconductor Package]

The present invention also provides a semiconductor package wherein a semiconductor device is mounted on said printed circuit board. The semiconductor package according to the present invention can be produced by mounting semiconductor devices such as a semiconductor chip, and memory, etc., to the predefined place on said printed circuit board, and sealing said semiconductor devices by sealing resin, etc.

EXAMPLES

Next, the present invention will be explained in more detail by Examples described below; however, these Examples do not restrict the present invention.

Meanwhile, the method of measuring the thickness of the prepreg portion of the copper clad laminate prepared in each example, the method of measuring the heat curing shrinkage rate of the resin composition used in each example, the evaluation method of workability of the prepreg produced in each example, and the method of measuring the amount of the warps after forming a circuit pattern using the copper clad laminate prepared in each example are as follows.

(1. Thickness of Laminate Excluding Copper Foil from Copper Clad Laminate)

The copper foil of the copper clad laminate prepared in each example was etched away to obtain the prepreg portion. Then, the thickness of laminate excluding copper foil from copper clad laminate was determined by using a micrometer (manufactured by Mitutoyo Corporation, tradename: High Precision Digimatic Micrometer MDH-25M).

(2. Heat Curing Shrinkage Rate of Resin Composition)

Resin powder removal from the resin film produced in each example was performed. Meanwhile, the resin powder passed through a #100 mesh sieve was used to make the powder size uniform.

The resin powder was put in Teflon (registered trademark) molded into a shape of 250 mm×150 mm×5 mm, and held for 3 minutes at 150° C. in a vacuum atmosphere to melt the resin powder, and a resin plate was obtained.

After cooling, standard points at intervals of 200 mm were formed on the resin plate, and the distance (W0) was measured with a dimension measurement device (manufactured by Mitutoyo Corporation, trade name: Non-Contact Image Measurement Device QVH606). Thereafter, heat treatment was carried out for the holding time of each example in a dryer adjusted to the maximum holding temperature of the heat treatment of each example. After cooling to room temperature, the distance (W1) between the standard points was measured, and the amount of change in distance between the standard points was determined from the following formula, and this was taken as the heat curing shrinkage rate.

$$\text{Amount of Change (\%)} = \{(W1-W0)/W0\} \times 100$$

(3. Workability of Prepreg)

The workability of the prepreg used in each example was evaluated by the powder removal property during handling of the prepreg.

Specifically, on a clean sheet, one prepreg used in each example was placed on a sheet, lifted it up, and then the front and the back were replaced, which were repeated three times, thereafter, the resin dropped off on a clean sheet was weighed and used as an indicator of the workability of the prepreg. The smaller the amount of powder dropped, the better the workability of the prepreg.

(4. Amount of Warp)

First, a 500 mm square test piece was cut out from the metal-clad laminate. To one side of the metal foil, a circuit pattern 1 of 5 mm diameter polka dots was formed so as to occupy 70% of the surface area of the metal foil, while to the other side of the metal foil, a circuit pattern 2 of 5 mm diameter polka dots was formed so as to occupy 50% of the surface area of the metal foil by the subtractive method to prepare a test substrate. The difference between the amount of metal of the circuit pattern 1 and the amount of metal of the circuit pattern 2 is 20% by volume.

Using this test substrate, the maximum vertical displacement was measured according to the measurement method described in section 2.4.22.1 C of IPC-TM-650, and this was taken as the amount of warp.

Furthermore, the average thickness a1 of the resin composition after being cured which is present on one surface of the fiber base material, the average thickness a2 of the resin composition after being cured which is present on other surface of the fiber base material, and the average thickness B of the fiber base material were measured according to the following measurement method to obtain $\{(a1+a2)/2\}/B$, and $a1/a2$, which were shown in Table 1.

(Measurement Methods of a1, a2, and B)

While a prepreg was hung down in a dryer, temperature of the dryer was raised from 20° C. to 160° C. at the rate of 5° C./hour, then the specimen having been kept at 160° C. for 30 minutes was put in a vessel while it was aligned with a thickness tape (manufactured by Tokyo Thickness Corp.) having a thickness of 0.01 mm measured in accordance with JIS B7524 (2008) [leaf shape: A type].

Then, as the material for the casting resin, 100 parts by mass of a bisphenol A liquid epoxy resin "jER (registered trade mark) 815" (manufactured by Mitsubishi Chemical Corp.) and 10 parts by mass of trimethyl tetramine (manufactured by Wako Pure Chemical Industries, Ltd.) were poured into the vessel after stirring. After having been degassed at the vacuum degree of 700 mmHg (93.3 kPa) for 3 minutes, the resin was cured at 40° C. for 60 minutes and then at 60° C. for 90 minutes. After having been cured, the cured product was taken out from the vessel, and it was cut and mechanically polished to expose the cross section thereof. Then, the cross section was observed with a scanning electron microscope (SEM) to measure the thickness of the resin composition which was present on one surface of the fiber base material, the thickness of the resin composition which was present on other surface of the fiber base material, and the thickness of the fiber base material.

Measurements were made in 10 portions not having clear scar, dent, or fracture; and an average value thereof was obtained for each of a1 (measured value), a2 (measured value), and B (measured value), which were then corrected as follows to obtain each of a1 (corrected value), a2 (corrected value), and B (corrected value), whereby these values were used as a1, a2, and B, respectively, in the formulae (1) and (2).

—Correction Method—

The thickness tape having the thickness of 0.01 mm is also observed with a scanning electron microscope (SEM), and similarly to the above, the thickness thereof is measured in 10 portions so as to obtain the average value thereof. By using the measured average value and 0.01 mm, the correction coefficient α is obtained by the following formula (3). By multiplying this correction coefficient α to each of a1 (measured value), a2 (measured value), and B (measured value), each of a1 (corrected value), a2 (corrected value), and B (corrected value) was obtained.

$$\alpha = 0.01 \text{ mm/measured average thickness value of thickness tape} \quad (3)$$

a1 (corrected value)=a1 (measured value)×α
a2 (corrected value)=a2 (measured value)×α
B (corrected value)=B (measured value)×α

Example 1

Prepreg i and Copper-Clad Laminate i were produced according to the following procedure.

(1-1-1. Production of Resin Varnish A)

The following components were dissolved in methyl ethyl ketone to prepare Resin Varnish A having a solid content concentration of 75% by mass.

20 parts by mass of bisphenol A type epoxy resin (manufactured by Mitsubishi Chemical Corp., trade name: jER (registered trade mark) 828, epoxy equivalent of about 190 g/eq)

50 parts by mass of cresol novolac epoxy resin (Nippon Steel & Sumikin Chemical Co., Ltd., trade name: YDCN-704, epoxy equivalent of about 210 g/eq)

120 parts by mass of cresol novolac epoxy resin (manufactured by IDC Corp., trade name: KA-1165, hydroxy group equivalent of 119 g/eq)

6 parts by mass of curing facilitator (manufactured by Shikoku Chemicals Corporation, trade name: CUREZOLE (registered trademark) 2E4MZ)

(1-1-2. Preparation of Resin Film A)

The Resin Varnish A obtained in the above was applied onto a PET film having the width of 580 mm (trade name: G-2, manufactured by Teijin DuPont Films Japan Ltd.) to obtain the Resin Film A, wherein the application was controlled such that the coating width thereof would become 525 mm with the thickness of 30 μm after being dried.

Next, in order to remove the organic solvent and heat cure the resin, heat curing with a hot air dryer at 140° C. was carried out, and adjusting the curing degree was performed such that the gelling time is 130±10 seconds when measuring by the test method No. 2.3.18 of IPC-TM-650, to provide Resin Film A (thickness of 30 μm).

(1-2-1. Preparation of Resin Varnish B)

The following components were dissolved in methyl ethyl ketone to prepare Resin Varnish B having a solid content concentration of 75% by mass.

20 parts by mass of bisphenol A type epoxy resin (manufactured by Mitsubishi Chemical Corp., trade name: jER (registered trade mark) 828, epoxy equivalent of about 190 g/eq)

50 parts by mass of cresol novolac epoxy resin (Nippon Steel & Sumikin Chemical Co., Ltd., trade name: YDCN-704, epoxy equivalent of about 210 g/eq)

130 parts by mass of phenol novolac epoxy resin (manufactured by IDC Corp., trade name: TD-2090, hydroxy group equivalent of 105 g/eq)

6 parts by mass of curing facilitator (manufactured by Shikoku Chemicals Corporation, trade name: CUREZOLE (registered trademark) 2E4MZ)

(1-2-2. Production of Resin Film B)

The same procedure as in the production of Resin Film A was repeated except that Resin Varnish B was used instead of Resin Varnish A, to obtain Resin Film B (thickness of 30 μm).

(1-3. Production of Prepreg i)

On the front and back surfaces of a glass cloth (manufactured by Nitto Boseki Co., Ltd., basis weight: 105 g/m², cloth thickness: 96 μm, IPC style: 2116), said Resin Films A and B were placed, respectively, and adhered under the lamination condition of heating temperature of 100° C., vacuum suction of 20 seconds, pressurization time of 30 seconds, pressure of 0.2 MPa by using a vacuum laminator (manufactured by Meiki Co., Ltd., trade name: MVLP-500), to produce a Prepreg i having different resin composition layers on two surfaces.

(1-4. Production of Copper-Clad Laminate i)

On both sides of one Prepreg i, a copper foil (manufactured by Nippon Denkai Ltd., trade name: YGP-35) was placed, and lamination was carried out with a vacuum pressure press under vacuum atmosphere with the conditions of pressure of 2.5 MPa, heating rate of 3° C./min, maximum holding temperature of 185° C., holding time of 90 minutes, and cooling time of 30 minutes, to produce a Copper-Clad Laminate i.

Example 2

A Prepreg ii and a Copper-Clad Laminate ii were produced in the following procedure.

(2-1-1. Production of Resin Varnish C)

In a container, 35.8 g of o-tolidine, 469.5 g of bis (4-maleimidophenyl) methane, 35.7 g of m-aminophenol and 360.0 g of dimethylacetamide were added to react them for 2 hours at 100° C. to obtain the solution containing polyimide compound having a biphenyl skeleton in the molecule (solid content concentration: 60% by mass).

50 parts by mass of the obtained solution containing the polyimide compound (solid content concentration: 60% by mass) and the following components were dissolved in methyl ethyl ketone to prepare Resin Varnish C having a solid content concentration of 65% by mass.

- 30 parts by mass of phenol novolac type epoxy resin (manufactured by DIC Corp., trade name: EPICLON (registered trademark) N-770, epoxy equivalent of 188 g/eq)
- 20 parts by mass of cresol novolac resin (manufactured by DIC Corp., trade name: PHENOLITE (registered trademark) KA-1165, hydroxy group equivalent of about 119 g/eq)
- 30 parts by mass of aluminum hydroxide (manufactured by Showa Denko K. K., trade name: HP-360)
- 90 parts by mass of fumed silica (manufactured by Admatechs Company Limited, average primary particle size of 0.5 µm, BET specific surface area of 6.8 $m^2/g$)
- 0.3 parts by mass of imidazole derivative (manufactured by DKS Co., Ltd., trade name: G8009L)

(2-1-2. Production of Resin Film C)

The above Resin Varnish C was applied to a 580 mm wide PET film (manufactured by Teijin DuPont Film Co., Ltd., trade name: G2) with adjustment of an application width of 525 mm and a thickness after drying of 20 µm.

Next, in order to remove the organic solvent and heat cure the resin, heat curing was performed with a hot air dryer at 150° C., and the degree of curing was adjusted such that gel time measured by the test method of IPC-TM-650, No. 2.3.18 was 150±10 seconds to obtain a Resin Film C (thickness of 20 µm).

(2-2-1. Production of Resin Varnish D)

In a container, 35.8 g of o-tolidine, 469.5 g of bis (4-maleimidophenyl) methane, 35.7 g of m-aminophenol and 360.0 g of dimethylacetamide were added to react them for 2 hours at 100° C. to obtain the solution containing polyimide compound having a biphenyl skeleton in the molecule (solid content concentration: 60% by mass).

50 parts by mass of the obtained solution containing the polyimide compound (solid content concentration: 60% by mass) and the following components were dissolved in methyl ethyl ketone to prepare Resin Varnish D having a solid content concentration of 65% by mass.

- 30 parts by mass of phenol novolac type epoxy resin (manufactured by DIC Corp., trade name: EPICLON (registered trademark) N-770, epoxy equivalent of 188 g/eq)
- 20 parts by mass of cresol novolac resin (manufactured by DIC Corp., trade name: PHENOLITE (registered trademark) KA-1165, hydroxy group equivalent of about 119 g/eq)
- 40 parts by mass of aluminum hydroxide (manufactured by Showa Denko K. K., trade name: HP-360)
- 120 parts by mass of fumed silica (manufactured by Admatechs Company Limited, average primary particle size of 0.5 µm, BET specific surface area of 6.8 $m^2/g$)
- 0.3 parts by mass of imidazole derivative (manufactured by DKS Co., Ltd., trade name: G8009L)

(2-2-2. Production of Resin Film D)

The same procedure as in the production of Resin Film C was repeated except that Resin Varnish D was used instead of Resin Varnish C, to obtain a Resin Film D (thickness of 20 µm).

(2-3. Production of Prepreg ii)

On the front and back surfaces of a glass cloth (manufactured by Nitto Boseki Co., Ltd., basis weight: 24 $g/m^2$, cloth thickness: 24 µm, IPC style: 1037), said Resin Films C and D were placed, respectively, and roll lamination was carried out. The pressure roll conditions for said roll lamination were a roll temperature of 100° C., a linear pressure of 0.2 MPa, and a rate of 2.0 m/min.

At that time, the surface of the thermosetting resin facing the glass cloth was heated by a halogen heater (Ushio Inc., trade name: UH-USF-CL-700), and the surface temperature was adjusted to be 120° C. at the point of 30 mm in front of the pressure roll. The glass cloth itself was also heated by the halogen heater, and adjusted so that the surface temperature becomes 135° C. at the point of 30 mm in front of the pressure roll to adhere to produce Prepreg ii having resin composition layers having different heat curing shrinkage rates on both sides.

(2-4. Production of Copper-Clad Laminate ii)

On both sides of one Prepreg ii, a copper foil (manufactured by Furukawa Electric Co., Ltd., trade name: GTS-12) was each placed, and lamination was carried out with a vacuum pressure press under vacuum atmosphere with the conditions of pressure of 3 MPa, heating rate of 4° C./min, maximum holding temperature of 240° C., holding time of 90 minutes, and cooling time of 30 minutes, to produce a Copper-Clad Laminate ii.

Example 3

(Production of Resin Film C')

The similar operation in Example 2 was carried out except that Resin Varnish C was adjusted to have a thickness of 30 µm after drying, to obtain Resin film C' (thickness of 30 µm).

(Production of Prepreg iii)

The same procedure as in Example 2 in the production of Prepreg ii was repeated except that Resin Film C' was used instead of Resin Film C, thereby producing Prepreg iii.

(Production of Copper-Clad Laminate iii)

Subsequently, in the production of Copper-Clad Laminate ii in Example 2, the procedure was repeated except that Prepreg iii was used instead of Prepreg ii to obtain Copper-Clad Laminate iii.

Comparative Example 1

(Production of Prepreg iv)

The same procedure as in Example 1 in the production of Prepreg i was repeated except that Resin Film A was placed on each of both sides of the glass cloth, instead of Resin Film B, thereby producing Prepreg iv.

(Production of Copper-Clad Laminate iv)

Subsequently, in the production of Copper-Clad Laminate i in Example 1, the procedure was repeated except that Prepreg iv was used instead of Prepreg i to obtain Copper-Clad Laminate iv.

Comparative Example 2

(Production of Prepreg v)

The same procedure as in Example 2 in the production of Prepreg ii was repeated except that Resin Film C was placed on each of both sides of the glass cloth, instead of Resin Film D, thereby producing Prepreg v.

(Production of Copper-Clad Laminate iv)

Subsequently, in the production of Copper-Clad Laminate ii in Example 2, the procedure was repeated except that Prepreg v was used instead of Prepreg ii to obtain Copper-Clad Laminate v.

Reference Example 1

(Production of Prepreg vii)

First, in the production of Prepreg i in Example 1, Resin Film A was not used, and procedures were performed in the same manner as in Example 1 except that Resin Film B was placed on both sides of the glass cloth, to produce Prepreg vi.

The thus obtained Prepreg vi was overlapped with Prepreg iii produced in Comparative Example 1 one by one to produce Prepreg vii.

(Production of Copper-Clad Laminate vii)

Subsequently, in the production of Copper-Clad Laminate i in Example 1, the procedure was repeated except that Prepreg vii was used instead of Prepreg i to obtain Copper-Clad Laminate vii.

The results of measurements, according to the above-mentioned measurement methods, of the thickness of the prepreg of the copper-clad laminate produced in each Example, the heat curing shrinkage rate of the resin composition used in each Example, the workability of the prepreg produced in each Example, and the amount of warp after the formation of circuit patterns using each of the copper-clad laminates produced in each Example are shown in Table 1.

TABLE 1

|  | Example | | | Comparative Example | | Reference Example | |
| --- | --- | --- | --- | --- | --- | --- | --- |
|  | 1 | 2 | 3 | 1 | 2 | 1 | |
| Prepreg | i | ii | iii | iv | v | vii (two piles) | |
|  | Resin Film A (30 μm) | Resin Film C (20 μm) | Resin Film C' (30 μm) | Resin Film A (30 μm) | Resin Film C (20 μm) | Resin Film A (30 μm) | Resin Film B (30 μm) |
|  | Glass Cloth (96 μm) | Glass Cloth (24 μm) | Glass Cloth (24 μm) | Glass Cloth (96 μm) | Glass Cloth (24 μm) | Glass Cloth (96 μm) | Glass Cloth (96 μm) |
|  | Resin Film B (30 μm) | Resin Film D (20 μm) | Resin Film D (20 μm) | Resin Film A (30 μm) | Resin Film C (20 μm) | Resin Film A (30 μm) | Resin Film B (30 μm) |
| a1 | 12 | 9 | 17 | 12 | 9 | 11 | 11 |
| a2 | 11 | 9 | 9 | 13 | 9 | 12 | 11 |
| B | 95 | 28 | 29 | 96 | 28 | 96 | 95 |
| $\{(a1 + a2)/2\}/B$ | 0.12 | 0.32 | 0.45 | 0.13 | 0.32 | 0.12 | 0.12 |
| a1/a2 | 1.09 | 1.00 | 1.89 | 0.92 | 1.00 | 0.92 | 1.00 |
| 1. Thickness (μm) | 105 | 48 | 55 | 104 | 47 | 197 | |
| 2. Heat Curing Shrinkage Rate (%) | Resin Varnish A −0.70 | Resin Varnish C −0.63 | Resin Varnish C −0.63 | Resin Varnish A −0.70 | Resin Varnish C −0.63 | Resin Varnish A −0.70 | Resin Varnish B −0.24 |
|  | Resin Varnish B −0.24 | Resin Varnish B −0.12 | Resin Varnish D −0.12 | Resin Varnish A −0.70 | Resin Varnish C −0.63 |  |  |
|  | Difference 0.46 | Difference 0.51 | Difference 0.51 | Difference 0.00 | Difference 0.00 | Difference 0.46 | |
| 3. Amount of Powder Drop Off (mg/sheet) | 2.3 | 1.6 | 15.3 | 2.6 | 1.9 | 2.4 | |
| 4. Amount of Warp (mm) | 28 | 47 | 51 | 51 | 79 | Unmeasurable[*1] | 17 |

[*1]Unmeasurable due to curling up

As shown in Table 1, in Example 1, as compared with Comparative Example 1, the warp after the formation of the circuit pattern is significantly reduced. Also, in Examples 2 and 3, the warp after the formation of the circuit pattern is significantly smaller than that in Comparative Example 2. In this way it has been clarified that the warp after the formation of the circuit pattern can be significantly reduced by that the heat curing shrinkage rate of the resin composition on the front is differentiated from that on the back of the prepreg according to the formation of the circuit pattern assumed, though both resin compositions on the front and back of the prepreg have been made to have exactly the same composition in the prior art.

In addition, the warp was much further reduced, and the amount of powder drop off is significantly low, and the handling property is good in Example 2 as compared with Example 3. This indicates that when the prepreg is a prepreg satisfying both of the above formulas (1) and (2), the warp is further easily reduced and the handling property is good.

As shown in Reference Example 1, in order to reduce warp, it is usually necessary to increase the thickness by overlapping two or more prepregs, but this is not preferable from the viewpoint of thinning.

REFERENCE SIGNS LIST a1: Average thickness of the resin composition after being cured which is present on one surface of the fiber base material a2: Average thickness of the resin composition after being cured which is present on other surface of the fiber base material B: Average thickness of the fiber base material

The invention claimed is:

1. A printed circuit board comprising a cured product of a prepreg comprising a fiber base material and a resin composition, in which circuit patterns of different amounts of metal are formed on both sides of one cured product of the prepreg, respectively, in which said prepreg has layers on the front and back of said fiber base material, wherein said layers comprise resin compositions having different heat curing shrinkage rates, in which among these layers, the layer made of the resin composition having a smaller heat curing shrinkage rate is present on the side on which the circuit pattern with a smaller amount of metal is formed, and wherein said prepreg satisfies a following formula (1) as well as a following formula (2):

$$0.12 < \{(a1+a2)/2\}/B < 0.32 \quad (1)$$

$$0.8 \leq a1/a2 \leq 1.25 \quad (2)$$

wherein a1 represents an average thickness of the resin composition after being cured which is present on one surface of the fiber base material; a2 represents an average thickness of the resin composition after being cured which is present on other surface of the fiber base material; and B represents an average thickness of the fiber base material.

2. The printed circuit board according to claim 1, wherein the layers comprising the resin compositions having different heat curing shrinkage rates on said each of the front and back of said fiber base material in said prepreg comprises different types of resin compositions.

3. The printed circuit board according to claim 1, wherein the difference between the heat curing shrinkage rates of the resin compositions forming the layers on each of the front and back of said fiber base material is 0.3% or above.

4. The printed circuit board according to claim 1, wherein the difference in the amount of metal between the circuit patterns on both sides is 15% by volume or above.

5. The printed circuit board according to claim 1, wherein the thickness of the prepreg is 30 μm to 170 μm.

6. The printed circuit board according to claim 1, wherein the stress generated by the difference in the amount of metal of one circuit pattern and the amount of metal of the other circuit pattern on said both sides is compensated by the stress generated by the difference in heat curing shrinkage rates of said resin compositions.

7. A semiconductor package comprising a semiconductor device mounted on the printed circuit board according to claim 1.

* * * * *